United States Patent [19]
Ujiie

[11] Patent Number: 5,534,464
[45] Date of Patent: Jul. 9, 1996

[54] SEMICONDUCTOR DEVICE HAVING A SEMICONDUCTOR CHIP MOUNTED ON AN INSULATING BODY

[75] Inventor: Masato Ujiie, Tokyo, Japan

[73] Assignee: NEC Corporation, Japan

[21] Appl. No.: 478,280

[22] Filed: Jun. 7, 1995

Related U.S. Application Data

[62] Division of Ser. No. 88,264, Jul. 7, 1993, Pat. No. 5,450,287.

[30] Foreign Application Priority Data

Jul. 10, 1992 [JP] Japan ................................. 4-182751

[51] Int. Cl.[6] ............................................. H01L 21/60
[52] U.S. Cl. .......................... 437/209; 437/211; 437/214; 437/217
[58] Field of Search ................................. 437/209, 211, 437/214, 215, 216, 217, 218, 219, 221

[56] References Cited

U.S. PATENT DOCUMENTS

| | | | |
|---|---|---|---|
| 4,633,573 | 1/1987 | Scherer | 437/209 |
| 4,999,319 | 3/1991 | Hamano et al. | 437/211 |
| 5,012,386 | 4/1991 | McShane et al. | 361/386 |
| 5,041,396 | 8/1991 | Valero | 437/209 |
| 5,098,864 | 3/1992 | Mahulikar | 437/211 |
| 5,155,067 | 10/1992 | Wood et al. | 437/209 |
| 5,173,451 | 12/1992 | Kinsman et al. | 437/217 |
| 5,200,367 | 4/1993 | Ko | 437/217 |
| 5,263,242 | 11/1993 | Singh Deo et al. | 437/209 |
| 5,319,224 | 6/1994 | Sakashita et al. | 437/209 |
| 5,407,502 | 4/1995 | Takenaka et al. | 437/215 |

*Primary Examiner*—Kevin M. Picardat
*Attorney, Agent, or Firm*—Laff, Whitesel, Conte & Saret, Ltd.

[57] ABSTRACT

A method of manufacturing a semiconductor device which includes providing an insulating substrate with a semiconductor chip mounted on a first face thereof. An insulating package member which is fixed on the first face of the substrate surrounds and houses the semiconductor chip. Various manufacturing steps are described, such as molding, grinding, and machining. In one step, ultrasonic waves are used to drive a grinding head. In another step, a rotating grinding wheel is used to mill out a groove. The method is designed to reduce warpage and improve the flatness of the substrate.

12 Claims, 6 Drawing Sheets

SEMICONDUCTOR DEVICE HAVING A SEMICONDUCTOR CHIP MOUNTED ON AN INSULATING BODY

This application is a division of prior application Ser. No. 08/088,264, filed Jul. 7, 1993 now U.S. Pat. No. 5,460,287.

BACKGROUND OF THE INVENTION

1. Field of the Invention

The present invention relates to a semiconductor device and more particularly, to a semiconductor device having a package and a semiconductor chip mounted therein.

2. Description of the Related Art

Figure 1A:
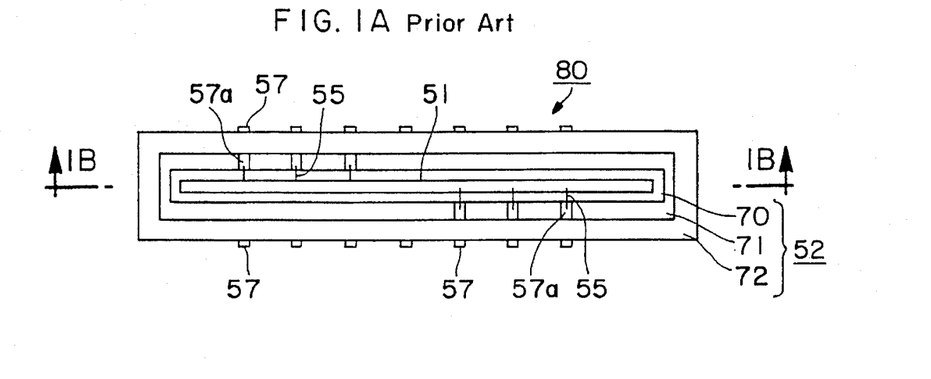
FIG. 1A is a plan view of a solid state imaging module as a conventional semiconductor device.
Figure 1B:
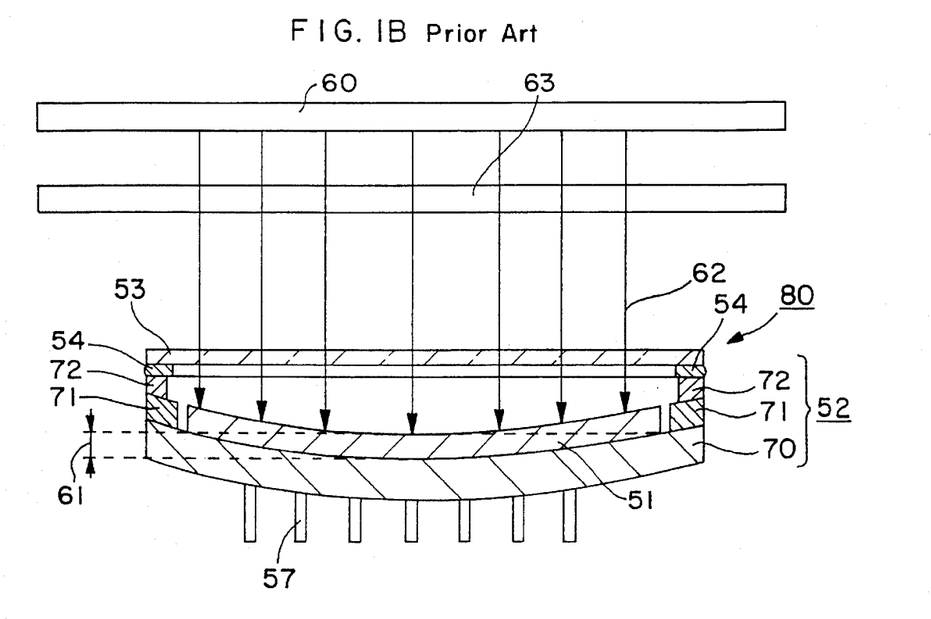
FIG. 1B is a cross section of the module taken along a line 1B, 1B in FIG. 1A in which the relative positional relationships among the module, an optical system and a rod lens in a facsimile are shown.
Figure 1C:
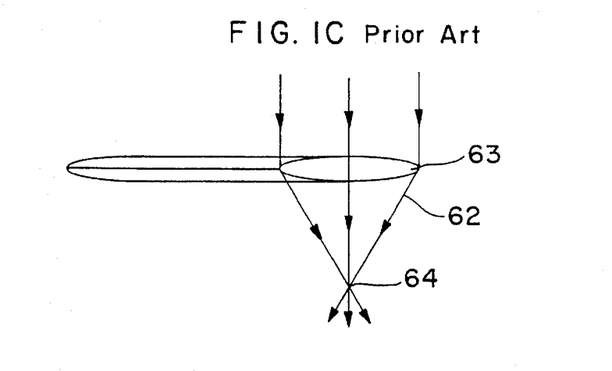
FIG. 1C is a perspective view of the rod lens shown in FIG. 1B.

FIGS. 1A, 1B and 1C show a conventional semiconductor device of this sort. This device is a solid state imaging module 80 and used for a facsimile, an electronic board apparatus and the like. In FIG. 1B, there are shown a relative positional relationship among an optical system 60, a rod lens 63 and the module 80 in a facsimile as well as a cross section of the module 80 taken along an X—X' line in FIG. 1A.

The solid state imaging module 80 has a semiconductor chip of a solid state imaging device 51 housed in a package. The device 51 is a strip-like one-dimensional image sensor with a size of 80 mm×1 mm. The package is composed of a body 52, and a transparent cap 53 which is formed by a rectangular plate and fixed on an opening end of the body 52. The body 52 of the package has a rectangular insulating ceramic substrate 70 and rectangular frame-like insulating ceramic plates 71 and 72. The device 51 is mounted on an upper face of the substrate 70 and at the center thereof. The ceramic plate 71 is fixed on the periphery of the upper face of the substrate 70, surrounding the device 51. The ceramic plate 72 is fixed on the plate 71. A cavity is formed on the substrate 70 by the plates 71 and 72. The solid state imaging device 51 is housed in the cavity. The bottom face of the device 51 is adhered on the upper face of the substrate 70 by an adhesive material of synthetic resin containing silver powder.

The rectangular cap 53 is made of a transparent material such as glass, plastics or the like, and adhered on the ceramic plate 72 by a sealing material 54 in order to seal the cavity for protecting the device 51. The sealing material 54 is either an adhesive made of synthetic resin or low-melting point glass. The ceramic substrate 70 constitutes the bottom of the package, the cap 53 constitutes the top of the package and the ceramic plates 71 and 72 constitute the side wall of the package.

Inner leads 57a, each of which is made of an electroconductive film, are disposed on the upper face of the ceramic plate 71 perpendicular to the longitudinal axis of the plate 71. Parts of the inner leads 57a are disposed between the plates 71 and 72. On the upper face of the solid state imaging device 51, electrodes or bonding pads (not shown) are formed at positions corresponding to the respective inner leads 57a. As shown in FIG. 1A, the bonding pads and the inner leads 57a are interconnected with each other by metal wires 55 which are attached by the wire bonding method. As the wire 55, a gold or an aluminum-silicon alloy wire having a diameter of 30 µm is generally employed.

Outer leads 57 are fixed on the side faces of the body 52 of the package, which are perpendicular to the longitudinal axis of the body 52 and extend up and down. The outer leads 57 are connected to the inner leads 57a respectively. The thickness of ceramic plate 71 is about the same as the thickness of the solid state imaging device 51. The ceramic plate 72 has a thickness which prevents any problem when forming a loop of the wire 55 during the wire bonding process. A rectangular opening in the ceramic plate 71 is a little larger than the device 51 so that the device 51 is not in contact with the plate 71. A rectangular opening in the ceramic plate 72 is a little larger than the opening in the plate 71 to prevent any problem during the bonding of the bonding pads of the device 51 to the inner leads 57a by the wires 55 in the wire bonding process.

In case that images wider than the width of the imaging module 80 are processed, a plurality of the modules 80 are adjacently disposed linearly. The respective images simultaneously processed by the plurality of modules 80. It is necessary to reduce the deviation and distortion of the images generated at the boundaries of the modules 80 in order to proceed the plurality of images precisely. Thus, each of the modules 80 should have a width which is as wide as possible.

However, when each of the modules 80 has such a wider width, there is a problem because the flatness of the mounting face or the upper face of the ceramic substrate 70, on which the solid state imaging device 51 is mounted, is reduced and the surface-roughness or irregularity of the mounting face is increased. For example, when the surface-roughness of the upper face of the substrate 70 is measured from one end of the face to the other by a surface-roughness tester, the maximum warpage of ±150 µm may be obtained.

Here, the "warpage" 61 of the mounting face means a distance between the center of the upper face (mounting face) and the end of the area contacting the device 51 in the direction perpendicular to a line connecting the both ends of the contacting area. Since the warpage of the substrate 70 is on the order of microns, it is invisible to the naked eye. Thus, the warpage is enlarged to be shown in FIG. 1B to make it clear.

For example, in a facsimile, as shown in FIGS. 1B and 1C, beams 62 of light emitted from an optical system 60 are respectively focused by a rod lens 63 to be irradiated on a light-receiving face of the solid state imaging device 51. In order to obtain clear images, it is necessary for the light-receiving face to be put in a region which is 20 µm or less away from the focal point 64 of the beams 62. Therefore, conventionally, it is necessary to select part of the fabricated package body 52, which have a warpage that is enough to obtain clear images.

As described above, with the conventional solid state imaging module 80, it is not possible to use all of fabricated package body 52, there arises a problem, so that there arises a problem the cost of the package becomes very high.

SUMMARY OF THE INVENTION

Accordingly, it is an object of the present invention to provide a semiconductor device in which a mounting face for a semiconductor chip has an improved flatness.

It is another object of the present invention to provide a semiconductor device with a reduced package cost.

A semiconductor device according to a first aspect of the present invention includes an insulating substrate having a semiconductor chip mounted on a first face thereof, and an insulating package member fixed on the first face surrounding the semiconductor chip. The chip is housed in a first cavity formed by the substrate and the package member. The inventive semiconductor device further includes a stress balancing member fixed on a second face of the substrate, the second face being opposite to the first face. The first cavity housing the chip is covered with a first lid member which is fixed on an open end of the package member.

With the semiconductor device of the first embodiment, the package member and the stress balancing member are respectively fixed on both sides of the substrate, so that the package structure is substantially or nearly symmetrical in in relation to the substrate. Therefore, stresses generated in the substrate due to the expansion and contraction thereof almost or substantially balance or cancel each other in a fabrication process of the device such as firing or burning of the substrate and the package, prior to mounting the semiconductor chip. Thus, there is very little warpage of the substrate. As a result, the flatness of the mounting face of the substrate can be improved.

In addition, since failures of the semiconductor device due to the warpage of the mounting face are prevented, the cost of the package can be reduced.

In a preferred embodiment semiconductor device of the, the package member and the stress balancing member are made substantially the same in material and configuration or shape. Since the stresses in the substrate are then better balanced, the possibility of the warpage of the mounting face is further reduced.

In another preferred embodiment, a second cavity formed by the substrate and the stress balancing member is covered by a second lid member. There is an advantage because the package is symmetrical in structure including the lid members.

In still another preferred embodiment, a dummy semiconductor chip having the same shape and material as the semiconductor chip is mounted on the second face of the substrate. There is an advantage because the semiconductor device is symmetrical in structure including the chips. Wiring is not required for the dummy chip mounted on the second face because the chip is not employed in the device operation.

A semiconductor device according to a second aspect of the present invention includes an insulating package body having a concavity. A semiconductor chip is mounted on a mounting face of the package body and housed in the concavity. A sealing member for sealing the concavity is fixed on an opening end of the package body. A side wall of the package body has windows formed at respective positions opposite to each other. The heights of the bottoms of the windows are the same or less than the height of the mounting face. Insulating side plates are provided in the windows respectively.

With the semiconductor device of the second aspect, since there are windows in the side wall of the package body whose bottoms are the same or less than the height of the mounting face, the mounting face can be grounded or polished by a grinding tool such as a grindstone prior to fixing the side plates to the package body. Thus, even if there is a large warpage which is not allowable in the mounting face of the substrate when fabricated, the mounting face can still be made flat or even by grinding the face.

As a result, the flatness of the mounting face can be improved. The cost of the package can be reduced because the failure due to the warpage is cancelled.

In the semiconductor devices of the first and second embodiments, preferably, the mounting face is grounded to improve its surface-roughness or irregularity by using ultrasonic waves.

DETAILED DESCRIPTION OF THE PREFERRED EMBODIMENTS

Preferred embodiments of the present invention will be described below referring to the drawings attached.

[First Embodiment]

Figure 2A:
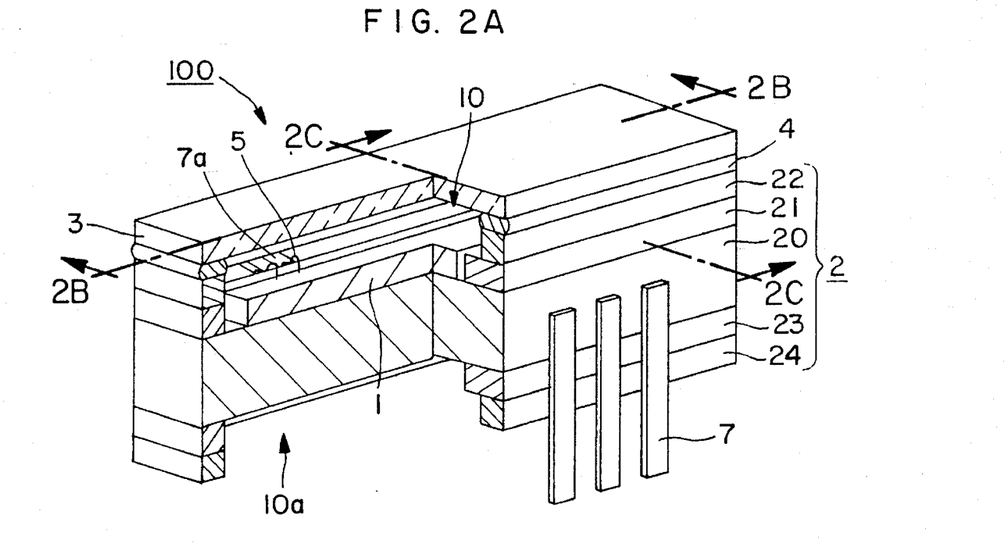
FIG. 2A is a perspective view, partially in section, of a semiconductor device according to a first embodiment of the present invention.
Figure 2B:
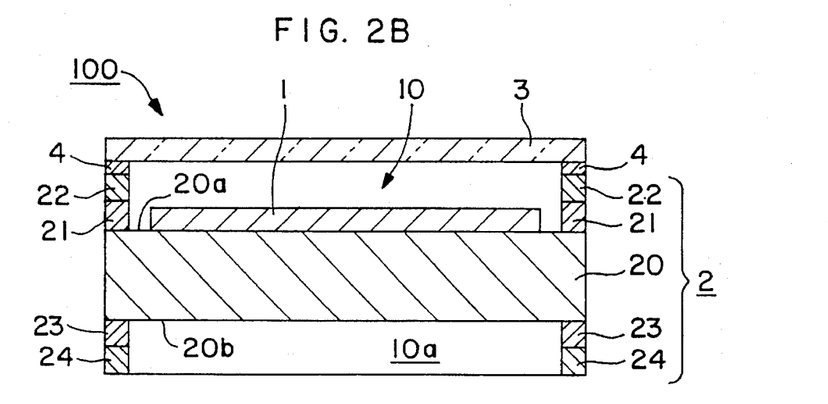
FIG. 2B is a cross section of the semiconductor device taken along a line 2B—2B in FIG. 2A.
Figure 2C:
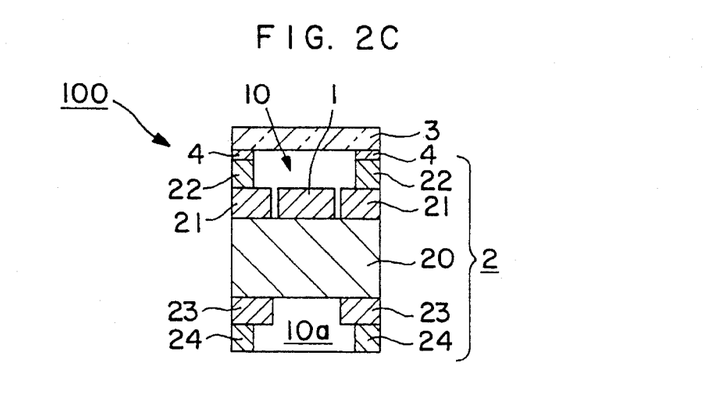
FIG. 2C is a cross section of the semiconductor device taken along a line 2C—2C in FIG. 2A.

In FIGS. 2A, 2B and 2C, a semiconductor device of a first embodiment is shown, which is a solid state imaging module.

As shown in FIG. 2A, a solid state imaging module 100 includes a semiconductor chip of a solid state imaging device 1 housed in a package. The device 1 is a strip-like one-dimensional image sensor with a size of 80 mm×1 mm.

The package is composed of a body 2, and a transparent cap 3 which is formed of a rectangular plate and fixed over an opening end of the body 2. The body 2 of the package has a rectangular insulating ceramic substrate 20 and rectangular frame-like insulating ceramic plates 21 and 22. The solid state imaging device 1 is mounted on an upper face 20*a* of the substrate 20 at the center thereof. The ceramic plate 21 is fixed on the periphery of the upper face of the substrate 20 surrounding the device 1. The ceramic plate 22 is fixed on the plate 21.

A first cavity 10 is formed on the substrate 20 by the plates 21 and 22. The solid state imaging device 1 is housed in the cavity 10. The bottom face of the device 1 is adhered on the upper face 20*a* of the substrate 20 by an adhesive made of synthetic resin containing silver powder. Thus, in the embodiment, the upper face 20*a* of the substrate 20 is the mounting face for the device 1.

The rectangular cap 3 is made of a transparent material such as glass, plastics or the like, and adhered on the ceramic plate 22 by a sealing material 4 in order to seal the first cavity 10 for protecting the device 1. The sealing material 4 is an adhesive made of synthetic resin or low-melting point glass. The ceramic substrate 20 constitutes the bottom of the package, the cap 3 constitutes the top of the package and the ceramic plates 71 and 72 constitute the side wall of the package.

On a lower face 20b of the substrate 20 are insulating ceramic plates 23 and 24 which are the same in shape and material as the ceramic plates 21 and 22, respectively. The frame-like plate 23 is fixed on the lower face 20b. The frame-like plate 24 is fixed on the plate 23. The plates 23 and 24 are also included in the package body 2.

A second cavity 10a is formed below the lower face 20b of the substrate 20 by the plates 23 and 24a and the substrate 20. There is no solid state imaging device in the second cavity 10a and no transparent cap on an opening end of the plate 24. The second cavity 10a is the same in shape as the first cavity 10.

Inner leads 7a, each of which is made of an electroconductive film made of tungsten or the like, are disposed on the upper face of the ceramic plate 21 perpendicular to the longitudinal axis of the plate 21 and parts of the inner leads 7a are disposed between the plates 21 and 22. On the upper face of the solid state imaging device 1, electrodes or bonding pads (not shown) are formed at positions corresponding to the respective inner leads 7a. As shown in FIG. 2A, the bonding pads and the inner leads 7a are interconnected with each other through metal wires 5 by the wire bonding method. As the wire 5, a gold or aluminum-silicon alloy wire having a diameter of 30 μm is generally employed.

Outer leads 7 are fixed on the side faces of the body 2 of the package, which are perpendicular to the longitudinal axis of the body 2 and extending up and down. The outer leads 7 are connected to the inner leads 7a respectively.

The thickness of ceramic place 21 is about the same as the thickness of the solid state imaging device 1. The ceramic plate 22 has a thickness which prevents problems during the forming of a loop of the wire 5 in the wire bonding process. A rectangular opening in the ceramic plate 21 is a little larger than the device 1 so that the device 1 is not in contact with the plate 21. A rectangular opening in the ceramic plate 22 is a little larger than that of the plate 21 so that there are no problem about bonding the bonding pads of the device 1 to the inner leads 7a through the wires 5 in the wire bonding process.

If necessary, there may be a multilayer wiring structure using a multilayer printed wiring board or the like in the first cavity 10. The outer leads 7 and the inner leads 7a are interconnected to the wiring structure. The multilayer wiring structure may be formed by tungsten-metalized layers or the like.

With the solid state imaging module 100, since the ceramic plates 21 and 22 are fixed on or above the upper face 20a of the substrate 20 and since the ceramic plates 23 and 24 are fixed on or under the lower face 20b thereof and since the ceramic plates are the same in shape and material, the structure of body 2 of the package is symmetrical in relation to the substrate 20. Therefore, during a process of firing or burning the substrate 20 for fabricating the module 100 prior to a process of mounting the solid state imaging device 1 on the substrate 20, stresses generated in the substrate 20 due to expansion and contraction of the substrate 20 are substantially balanced or cancelled with each other.

Thus, the possibility of warpage of the substrate 20 can be substantially cancelled and as a result, the flatness of the mounting face 20a of the substrate 20 can be improved.

In addition, since failures or troubles of the module 100 due to the warpage of the substrate 20 are prevented, the cost of the package can be reduced.

As described above, with the solid state imaging module 100, the mounting face 20a with a better flatness can be obtained easily; however, the flatness can be further improved by processing the face 20a using ultrasonic waves.

More particularly, the body 2 of the package is made through a firing or burning process. Then, the flatness of the mounting face 20a is measured by using a surface roughness tester. The measurement is carried out in the direction parallel to the long sides of the face 20a with the top face of the body 2 or the top end of the ceramic plate 22 being used as a standard. The measurement may be several times in the direction parallel to the short sides of the face 20a with a variation of the measuring point. The three-dimensional inclination and/or warpage of the mounting face 20a can be obtained by the measurement. Next, the face 20a is processed by an ultrasonic machining according to the result of the measurement, as shown in FIG. 3.

In case that the solid state imaging module 100 is employed in an apparatus such as a facsimile or the like, the top face of the body 2 or the top end of the ceramic plate 22 is generally used as a standard on positioning elements of the apparatus and the module 100. However, the bottom face of the body 2, that is the bottom end of the ceramic plate 24, or the side face of the body 2 may be used as the standard.

Figure 3:
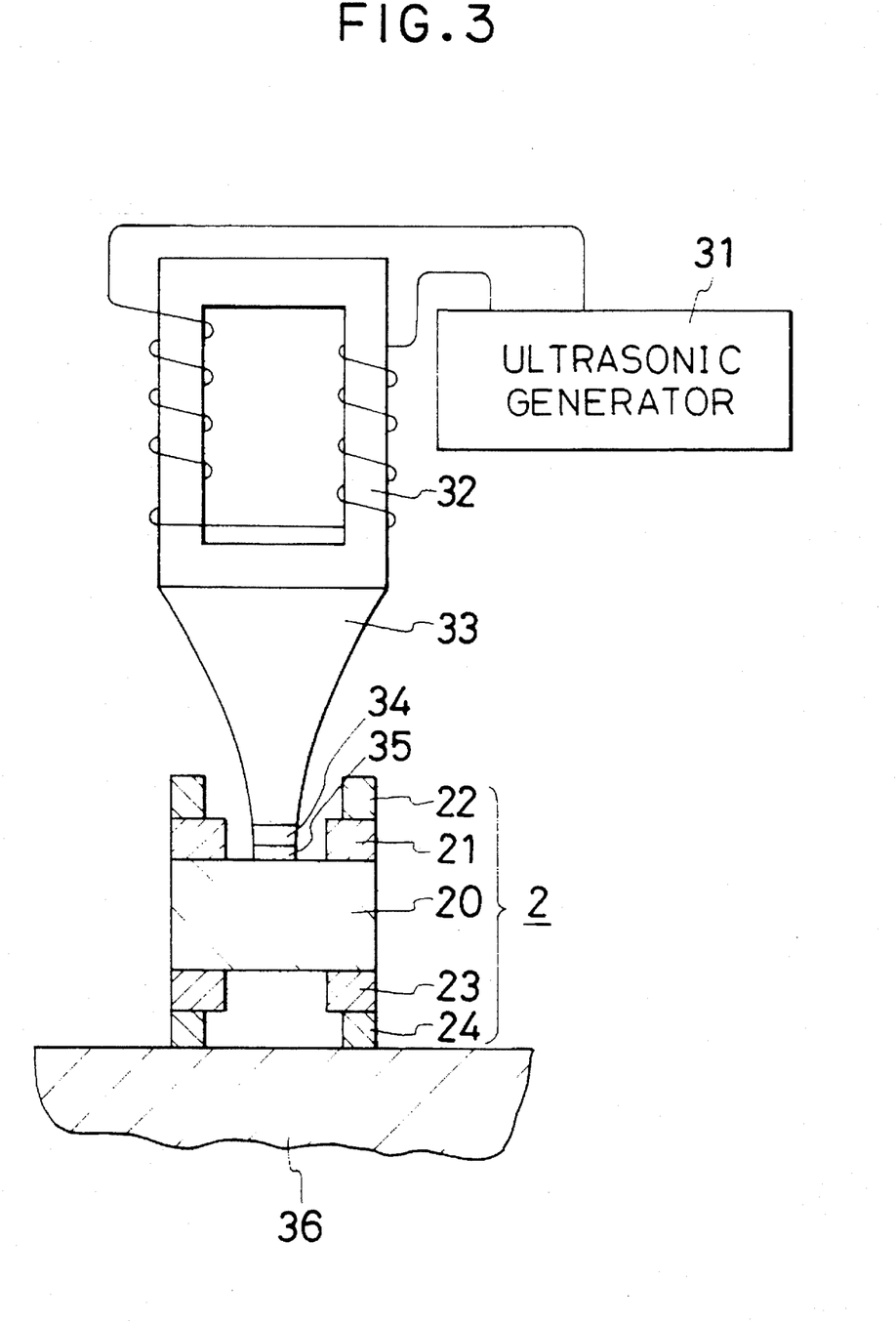
FIG. 3 is a schematic view showing a state in which the package of the semiconductor device according to the first embodiment is grounded using an ultrasonic processing unit.

In FIG. 3, the body 2 of the package is put on a work-table 36. A mixture 35 of an abrasive grain and a machining liquid is set on the mounting face 20a of the substrate 20. Then a tool 34 such as an abrasive grind wheel fixed to an end of an exponential horn 33 is put into contact with the mixture 35. Ultrasonic waves generated in an ultrasonic generator 31 are propagated through a magnetostriction oscillator 32 and the exponential horn 33 to the tool 34. The mounting face 20a is grounded or polished by the ultrasonic-vibrating tool 34 to improve the flatness and remove the surface-roughness.

In the ultrasonic machining method, one impact of the ultrasonic vibration does little; however, there are very many impacts per unit time, so with there is an advantage that the machining speed being very high. In addition, since only a little amount of surface removal per cycle is repeated many times to process the mounting face 20a, a greatly reduced surface-roughness of the face 20a can be obtained. For example, the surface-roughness of 0.2 μm, which is equivalent to the classification 0.2S in Japan Industrial Standard (JIS), or less can be obtained.

For example, the flatness or warpage of the face 20a can be made ±15 μm or less with the face 20a being parallel to the standard, which is the bottom face of the body 2 here. In case the solid state imaging module 100 is applied to a facsimile or the like, if the relative position of the module 100 to its lens can be adjusted without changing their relative positions, the relative positions of the body 2 of the package and the machining face of the tool 34 are adjusted so that the warpage of the mounting face 20a is made 30 μm or less by the ultrasonic machining. Thus, the dispersion of the distance between the module 100 and an optical system is restrained.

The same measurement, as described above, may be carried out after the ultrasonic machining is interrupted. In this case, the same ultrasonic machining may be started again in response to the result of the secondary measurement.

In the above description, after the ceramic plates 21, 22, 23 and 24 are fixed to the substrate 20, the ultrasonic machining of the mounting face 20a is carried out. However, the ultrasonic machining may be carried out prior to the fixation of the plates 21, 22, 23 and 24. In that case, the entirety or mounting area of the upper face 20a is processed by using the ultrasonic waves without measuring by the surface roughness tester, and then the ceramic plates 21, 22, 23 and 24 are fixed. Then, the surface-roughness of the face 20a is measured by the tester. If necessary, the ultrasonic machining is carried out again according to the result of the measurement.

Two frame-like ceramic plates may be respectively fixed to the upper and lower faces 20a and 20b of the substrate 20 instead of the ceramic plates 21, 22, 23 and 24.

The side wall of the body 2 of the package may be formed by sintering ceramic powder in a mold. The molded device may be used instead of the ceramic plates 21, 22, 23 and 24, and may be ultrasonically machined.

[Second Embodiment]

Figure 4A:
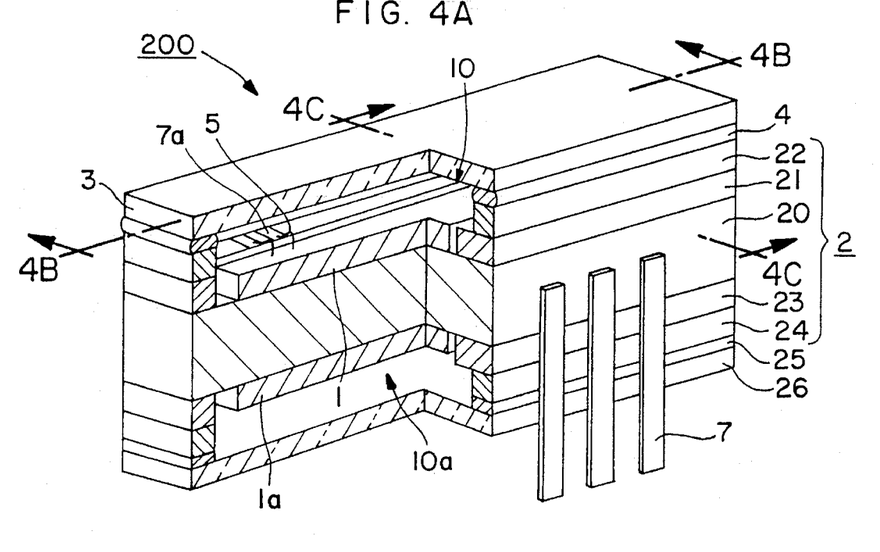
FIG. 4A is a perspective view, partially in section, of a semiconductor device according to a second embodiment of the present invention.
Figure 4B:
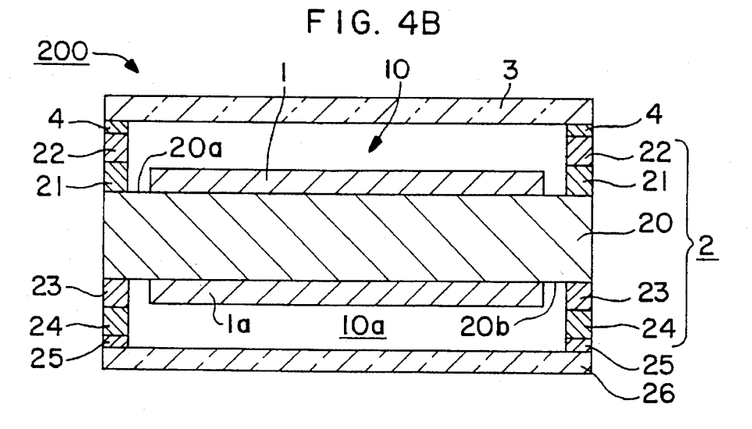
FIG. 4B is a cross section of the semiconductor device taken along a line 4B—4B in FIG. 4A.
Figure 4C:
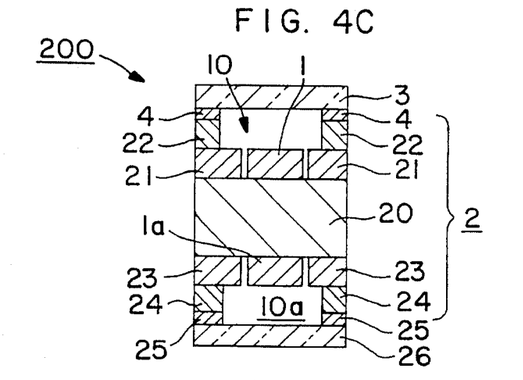
FIG. 4C is a cross section of the semiconductor device taken along a line 4C—4C in FIG. 4A.

FIGS. 4A, 4B and 4C show a semiconductor device of a second embodiment of the present invention. The solid state imaging module 200 of the second embodiment has the same structure as the module 100 of the first embodiment except that a transparent cap 26 is fixed to the bottom end of the ceramic plate 24, and a semiconductor chip 1a is adhered to the lower face 20b of the substrate 20.

The cap 26 is fixed to the bottom face of the plate 24 by a sealing material 25 to seal a second cavity 10a formed under the substrate 20. The caps 3 and 26 are made in the same shape and of the same material. The sealing material 25 is the same as the sealing material 4. The semiconductor chip of a solid state imaging device 1a is the same in shape or structure and material.

In the second embodiment, the entire structure of the module 200 is symmetrical. In other words, not only the body 2 of the package but also the caps 3 and 26 and the sealing material 4 and 25 are symmetrical to each other. Therefore, the warpage of the mounting face 20a is less than that of the first embodiment.

The imaging device 1a is not employed to the operation of the module, it may have a trouble or failure. The device 1a may not be provided.

Since thermal stresses on adhesion become equal to each other so that the warpage of the substrate 20 is less, preferably, the fixation of the caps 3 and 26 to the body 2 are carried out at the same time.

[Third Embodiment]

Figure 5:
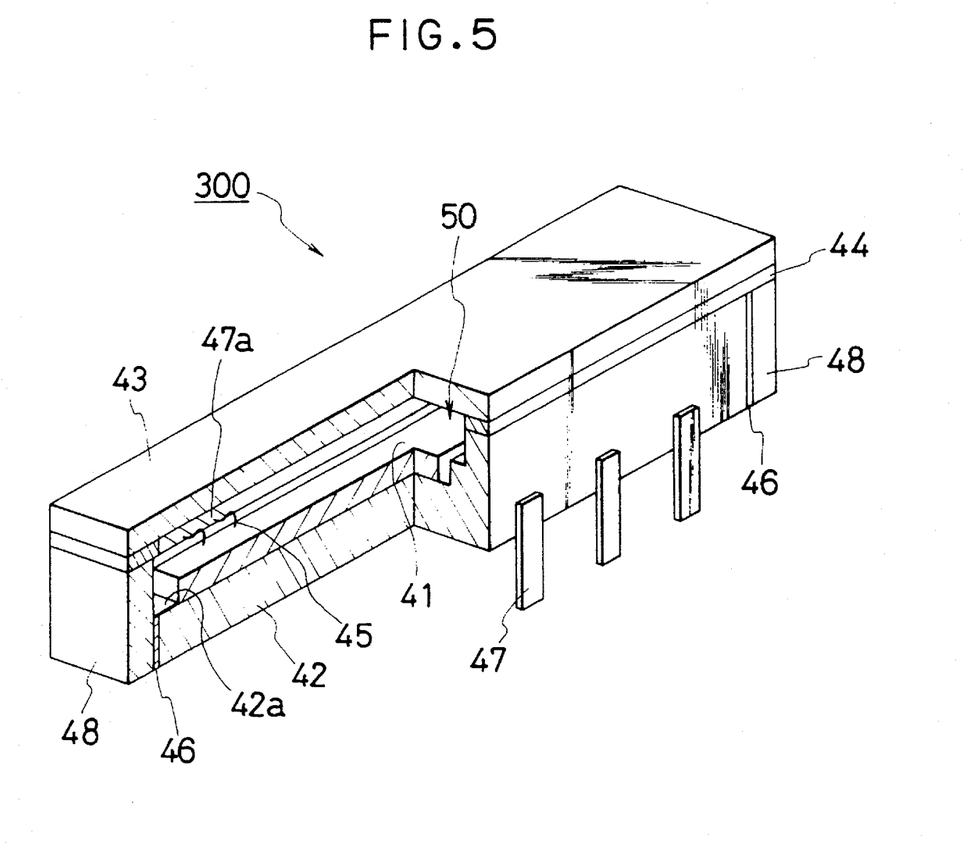
FIG. 5 is a perspective view, partially in section, of a semiconductor device according to a third embodiment of the present invention.

FIG. 5 shows a semiconductor device of a third embodiment of the present invention, which is also a solid state imaging module with a semiconductor chip of a one-dimensional image sensor.

Figure 6A:
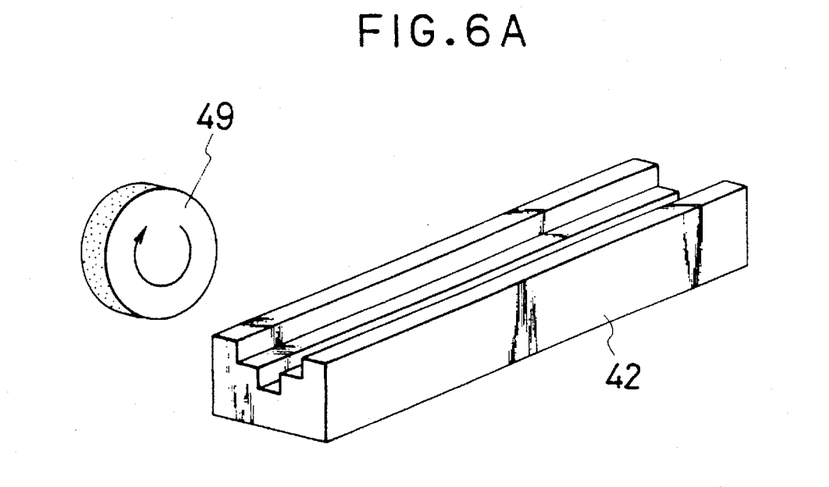
FIGS. 6A to 6C are schematic views showing a fabricating process of the semiconductor device according to the third embodiment, respectively.

In FIG. 5, the solid state imaging module 300 comprises a body 42 of a package, which has a concavity and an upper opening end as shown in FIG. 6A. The body 42 is made of ceramic, glass-reinforced epoxy resin, plastics or the like, and a semiconductor chip 41 can be housed in the concavity.

As shown in FIG. 6A, a side wall of the package body 42 has windows formed in opposite short sides thereof respectively. The bottoms of the windows are at the same in height as the mounting face 42a of the body 42. Side plates 48 are fixed to the body 42 at the respective windows by adhesive materials 46. The height of the side plates 48 is the same as the height of the side walls of the body 42 formed in its long sides. The plates 48 are made of ceramic, plastics, glass-reinforced epoxy resin, metal or the like. The adhesive materials 46 are made of synthetic resin adhesive, low-melting point glass, brazing metal or the like.

A rectangular transparent cap 43 is fixed on the top side of the body 42 and the side plates 48 by a sealing material 44. A cavity 50 is formed by the body 42, the side plates 48 and the cap 43. The semiconductor chip 41 of a solid state imaging device is adhered on the mounting face 42a of the package body 42 in the cavity 50. The body 42, the side plates 48 and the cap 43 constitute the package.

Inner leads 47a, each of which is made of an electroconductive film, are disposed on the top side of the body 42 perpendicular to the longitudinal axis of the body 42. Parts of the inner leads 47a are disposed between the body 42 and the sealing material 44. On the upper face of the solid state imaging device 41, electrodes or bonding pads (not shown) are formed at positions corresponding to the respective inner leads 47a. As shown in FIG. 5, the bonding pads and the inner leads 57a are interconnected with each other by metal wires 45 which are attached by the wire bonding method.

Outer leads 47 are fixed on the side walls of the body 42 by using a brazing metal. Leads 47 are perpendicular to the longitudinal axis of the body 42 and extend up and down. The outer leads 47 are connected to the inner leads 47a respectively. The bonding pads and the inner leads 47a are interconnected by metal wires 45 which are attached by the wire bonding method.

Next, a fabrication method of the solid state imaging module 300 is shown below.

First, the package body 42 having a shape shown in FIG. 6A is formed by molding a ceramic, glass-reinforced epoxy resin, plastics or the like. The body 42 thus obtained has a large warpage so that the device 41 cannot mounted on the mounting face 42a.

Figure 6B:
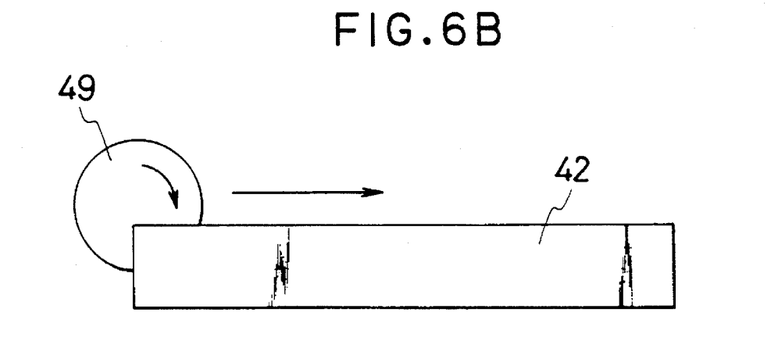

Next, as shown in FIG. 6B, the mounting face 42a is grounded to become flat and/or level by using a rotating grindstone or grinding wheel 49. The operation is easy to be carried out since the windows are provided in the body 42.

Figure 6C:
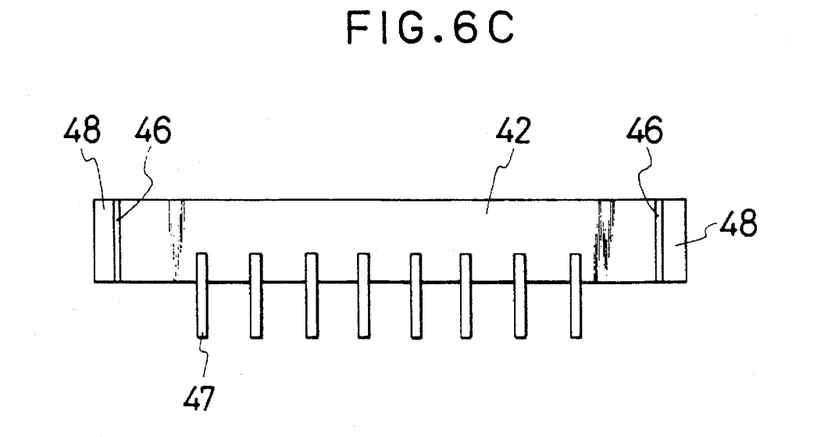

As shown in FIG. 6C, the outer leads 47 are fixed to the side walls of the body 42 by a brazing metal. Then the side plates 48 are fixed to the body 42 at its short sides by using the adhesive materials 46 respectively.

The flatness of the mounting face 42a is measured by using the surface roughness tester and if necessary, the ultrasonic machining may be carried out. As shown in FIG. 5, the solid state imaging device 41 is adhered to the face 42a by an adhesive material. The bonding pads and the inner leads 47a are interconnected to each other through the metal. The transparent cap 43 is fixed to the top side of the package body 42, the side plates 48 and the side walls of the body 42. Thus, the solid state imaging module 300 shown in FIG. 5 can be obtained.

With the module 300 of the embodiment, since the mounting face 42 is grounded by the rotating grindstone 49 and then subjected to the ultrasonic machining if necessary, the face 42a can be made about 10 μm in flatness. Thus, the effects are the same as they are in the first and second embodiments. In addition, the dispersion of the distance between the module 300 and an optical system is restrained.

As described, with the above first to third embodiments, the flatness of the mounting face for the semiconductor chip can be made 40 μm or less or on the order of submicrons, so that all of the fabricated packages can be employed and as a result, the cost of the package can be largely reduced.

In addition, in case the semiconductor device of the present invention is used in an apparatus such as facsimile or the like, the dispersion of the distance between the device and its optical system can be restrained within the allowable range, and can be improved in optical matching between the semiconductor device and the optical system. This means that clearer image can be obtained.

What is claimed is:

1. A method of fabricating a semiconductor device, said method comprising the steps of:
   (a) preparing an insulating package body with a mounting face for receiving a semiconductor chip, said package body having a side wall that surrounds said mounting face to produce a concavity on and adjacent to said mounting face, said side wall having windows formed at respective positions opposite each other, and bottoms of said windows being at a level which is no higher than a level of said mounting face;
   (b) fixing insulating side plates to said respective windows;
   (c) mounting said semiconductor chip on said mounting face, said chip being housed within said concavity; and
   (d) fixing a sealing member to an opening end of said package body.

2. The method according to claim 1, wherein step (a) of preparing said package body is carried out by a molding process.

3. The method according to claim 2, further comprising a step (e) of machining said mounting face to flatten and reduce warpage of said mounting face prior to said step (b) of fixing said side plates.

4. The method according to claim 3, wherein a grinding tool is used during said step (e) of machining said mounting face.

5. The method according to claim 4, wherein said grinding tool is a rolling grinding wheel, and said rolling grinding wheel is moved along said mounting face to pass through said windows of said side wall.

6. The method according to claim 1, further comprising a step of using ultrasonic waves during said machining of said mounting face in order to reduce a surface-roughness of said mounting face.

7. A method of fabricating a semiconductor device, said method comprising the steps of:
   (a) preparing an insulating package body with a rectangular mounting face having relative long opposing sides and short opposing sides, said package body having side walls formed at said opposing long sides of said mounting face, respectively, and said package body having windows formed at said opposing short sides of said mounting face, respectively;
   (b) fixing insulating side plates to said respective windows, said side plates and said side walls producing a concavity on and adjacent to said mounting face;
   (c) mounting a semiconductor chip on said mounting face, said chip being housed within said concavity; and
   (d) covering said concavity by fixing a sealing member on said side walls of said packaging body and on said side plates.

8. The method according to claim 7, wherein said step (a) of preparing said package body is carried out by a molding process.

9. The method according to claim 8, further comprising a step (e) of machining said mounting face to flatten and reduce warpage of said mounting face prior to said step (b) of fixing said side plates.

10. The method according to claim 9, wherein a grinding tool is used during said step (e) of machining said mounting face.

11. The method according to claim 10, wherein said grinding tool is a rolling grinding wheel, and said rolling grinding wheel is moved along said mounting face to pass through said windows of said side wall.

12. The method according to claim 7, further comprising a step of using ultrasonic waves during said machining of said mounting face in order to reduce a surface-roughness of said mounting face.

* * * * *

UNITED STATES PATENT AND TRADEMARK OFFICE
CERTIFICATE OF CORRECTION

PATENT NO. : 5,534,464
DATED : July 9, 1996
INVENTOR(S) : Masato Ujiie

It is certified that error appears in the above-indentified patent and that said Letters Patent is hereby corrected as shown below:

Column 2, Line 13, after images insert --are--.

Column 2, Line 50, after 52 delete ", there arises a problem".

Column 2, Line 50, after that delete "there arises".

Column 2, Line 51, delete "a problem".

Column 3, Line 7, after in delete "in".

Column 3, Line 19, after embodiment insert --of the-- and after device delete "of the".

Column 5, Line 33, after and delete "ing" from extend.

Column 5, Line 42, delete "are" and insert --is--.

UNITED STATES PATENT AND TRADEMARK OFFICE
CERTIFICATE OF CORRECTION

PATENT NO. : 5,534,464
DATED : July 9, 1996
INVENTOR(S) : Masato Ujiie

It is certified that error appears in the above-indentified patent and that said Letters Patent is hereby corrected as shown below:

Column 8, Line 35, after cannot insert --be--.

Signed and Sealed this

Thirty-first Day of December, 1996

Attest:

BRUCE LEHMAN

Attesting Officer

Commissioner of Patents and Trademarks